US012591177B2

(12) United States Patent
Werkman et al.

(10) Patent No.: US 12,591,177 B2
(45) Date of Patent: Mar. 31, 2026

(54) METHOD FOR OBTAINING TRAINING DATA FOR TRAINING A MODEL OF A SEMICONDUCTOR MANUFACTURING PROCESS

(71) Applicant: ASML NETHERLANDS B.V., Veldhoven (NL)

(72) Inventors: Roy Werkman, Eindhoven (NL); Lydia Marianna Vergaij-Huizer, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 321 days.

(21) Appl. No.: 17/289,290

(22) PCT Filed: Sep. 26, 2019

(86) PCT No.: PCT/EP2019/076072
§ 371 (c)(1),
(2) Date: Apr. 28, 2021

(87) PCT Pub. No.: WO2020/099011
PCT Pub. Date: May 22, 2020

(65) Prior Publication Data
US 2021/0405544 A1 Dec. 30, 2021

(30) Foreign Application Priority Data

Nov. 14, 2018 (EP) ..................................... 18206285

(51) Int. Cl.
| | |
|---|---|
| *G05B 13/00* | (2006.01) |
| *G03F 7/00* | (2006.01) |
| *G06F 18/214* | (2023.01) |
| *G06N 3/04* | (2023.01) |
| *G06N 3/08* | (2023.01) |

(52) U.S. Cl.
CPC .......... *G03F 7/70508* (2013.01); *G03F 7/705* (2013.01); *G03F 7/70525* (2013.01); *G05B 13/00* (2013.01); *G06F 18/214* (2023.01); *G06N 3/04* (2013.01); *G06N 3/08* (2013.01)

(58) Field of Classification Search
None
See application file for complete search history.

(56) References Cited

U.S. PATENT DOCUMENTS

| | | | |
|---|---|---|---|
| 2003/0000922 A1* | 1/2003 | Subramanian .... | H01L 21/67253 216/60 |
| 2003/0083757 A1* | 5/2003 | Card .................... | G05B 13/027 700/36 |
| 2004/0078108 A1* | 4/2004 | Choo ..................... | H01L 22/20 700/121 |
| 2006/0033921 A1 | 2/2006 | Den Boef et al. | |
| 2006/0066855 A1 | 3/2006 | Boef et al. | |

| | | | |
|---|---|---|---|
| 2007/0100487 A1* | 5/2007 | Cheng .............. | G05B 19/41875 700/51 |
| 2008/0058978 A1* | 3/2008 | Cain ........................ | G06F 30/20 700/121 |
| 2009/0063076 A1 | 3/2009 | Liu et al. | |
| 2009/0153818 A1 | 6/2009 | Chauhan et al. | |
| 2009/0157577 A1 | 6/2009 | Chauhan et al. | |
| 2010/0201963 A1 | 8/2010 | Cramer et al. | |
| 2011/0027704 A1 | 2/2011 | Cramer et al. | |
| 2011/0043791 A1 | 2/2011 | Smilde et al. | |
| 2011/0102753 A1 | 5/2011 | Van De Kerkhof et al. | |
| 2012/0044470 A1 | 2/2012 | Smilde et al. | |
| 2012/0123581 A1 | 5/2012 | Smilde et al. | |
| 2012/0226644 A1* | 9/2012 | Jin .......................... | G06N 3/045 706/19 |
| 2013/0110477 A1* | 5/2013 | Pandev .............. | G03F 7/70625 703/2 |
| 2013/0258310 A1 | 10/2013 | Smilde et al. | |
| 2013/0271740 A1 | 10/2013 | Quintanilha | |
| 2015/0235108 A1 | 8/2015 | Pandev | |

(Continued)

FOREIGN PATENT DOCUMENTS

| | | |
|---|---|---|
| EP | 3382606 | 10/2018 |
| EP | 3547031 | 10/2019 |

(Continued)

OTHER PUBLICATIONS

CN_110352430_A, Oct. 2019.*
WO_2018194707_A1, Oct. 2018.*
Le et al. "Using Synthetic Data to Train Neural Networks is Model-Based Reasoning", IEEE, 2017, p. 1-8. (Year: 2017).*
JP_2008523458_A, Jul. 2008.*
Taiwanese Office Action issued in corresponding Taiwanese Patent Application No. 110102411, dated Mar. 9, 2022.
Office Action issued in corresponding Korean Patent Application No. 10-2021-7014418, dated Jan. 17, 2023.
International Search Report and Written Opinion issued in corresponding PCT Patent Application No. PCT/EP2019/076072, dated Nov. 12, 2019.

(Continued)

*Primary Examiner* — Hien D Khuu
(74) *Attorney, Agent, or Firm* — Pillsbury Winthrop Shaw Pittman, LLP

(57) ABSTRACT

A method for obtaining a training data set including synthetic metrology data, the training data set being configured for training of a model relating to a manufacturing process for manufacturing an integrated circuit. The method includes obtaining behavioral property data describing a behavior of a process parameter resultant from the manufacturing process and/or a related tool or effect. Additionally, or alternatively metrology data performed on a structure formed by the manufacturing process and/or a similar manufacturing process may be obtained. Using the behavioral property data and/or metrology data, synthetic metrology data is determined, which describes the effect of variations in the manufacturing process, and/or a related tool or effect on the process parameter. The model is trained using the training data set including the synthetic metrology data.

20 Claims, 3 Drawing Sheets

(56)                References Cited

U.S. PATENT DOCUMENTS

| | | | | |
|---|---|---|---|---|
| 2016/0117812 A1* | 4/2016 | Pandev | ................. | G06F 18/214 |
| | | | | 382/149 |
| 2016/0148850 A1* | 5/2016 | David | ................. | G03F 7/70633 |
| | | | | 355/53 |
| 2017/0109646 A1* | 4/2017 | David | ................. | G03F 7/70625 |
| 2017/0255112 A1 | 9/2017 | Van Leest et al. | | |
| 2017/0255736 A1* | 9/2017 | Van Leest | ............. | G03F 9/7003 |
| 2017/0357155 A1 | 12/2017 | Quintanilha et al. | | |
| 2018/0196349 A1* | 7/2018 | Liu | ......................... | G03F 7/705 |
| 2019/0181025 A1* | 6/2019 | Ota | ................... | H01L 21/30604 |
| 2020/0134446 A1* | 4/2020 | Soni | ....................... | G06N 3/047 |
| 2021/0405544 A1 | 12/2021 | Werkman et al. | | |

FOREIGN PATENT DOCUMENTS

| | | |
|---|---|---|
| TW | 201743141 | 12/2017 |
| TW | I720654 | 3/2021 |
| WO | 2004031875 | 4/2004 |
| WO | 2009078708 | 6/2009 |
| WO | 2009106279 | 9/2009 |
| WO | 2013178422 | 12/2013 |
| WO | 2017108453 | 6/2017 |

OTHER PUBLICATIONS

European Search Report issued in corresponding European Patent Application No. 18206285, dated Apr. 26, 2019.

Taiwanese Search Report issued in corresponding Taiwanese Patent Application No. 108137300, dated Sep. 4, 2020.

Office Action issued in corresponding Chinese Patent Application No. 201980074980.0, dated Dec. 14, 2023.

* cited by examiner

METHOD FOR OBTAINING TRAINING DATA FOR TRAINING A MODEL OF A SEMICONDUCTOR MANUFACTURING PROCESS

CROSS-REFERENCE TO RELATED APPLICATIONS

This application is the U.S. national phase entry of PCT Patent Application No. PCT/EP2019/076072 which was filed on Sep. 26, 2019, which is based upon and claims the benefit of priority of European Patent Application No. 18206285.1 which was filed on Nov. 14, 2018, each of which is incorporated herein in its entirety by reference.

BACKGROUND

Field of the Invention

The present invention relates to methods and apparatus for applying patterns to a substrate in a lithographic process and/or measuring said patterns.

Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth (CD) of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Examples of known scatterometers include angle-resolved scatterometers of the type described in US2006033921A1 and US2010201963A1. The targets used by such scatterometers are relatively large, e.g., 40 µm by 40 µm, gratings and the measurement beam generates a spot that is smaller than the grating (i.e., the grating is underfilled). In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

In performing semiconductor manufacturing processes, such as application of a pattern on a substrate or measurement of such a pattern, process control methods are used to monitor and control the process. Such process control techniques are typically performed based on a control strategy so as to obtain corrections for semiconductor manufacturing processes based on a metrology effort. By increasing the metrology effort, in principle, better corrections and control can be achieved (within limits). However, metrology takes time and therefore will effect throughput, productivity and therefore profitability of a manufacturing process.

It would be desirable to provide more training data for training a model used to advise on a manufacturing process.

SUMMARY OF THE INVENTION

In a first aspect of the invention, there is provided a method for obtaining a training data set comprising synthetic metrology data, said training data set being configured for training of a model relating to a manufacturing process for manufacturing an integrated circuit, the method comprising: obtaining behavioral property data describing a behavior of a process parameter resultant from the manufacturing process and/or a related tool or effect; determining, from said behavioral property data, said synthetic metrology data describing the effect of variations in said manufacturing process, and/or a related tool or effect on said process parameter; and using said training data set comprising said synthetic metrology data to train said model.

In a second aspect of the invention, there is provided a computer program comprising program instructions operable to perform the method of the first aspect when run on a suitable apparatus.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
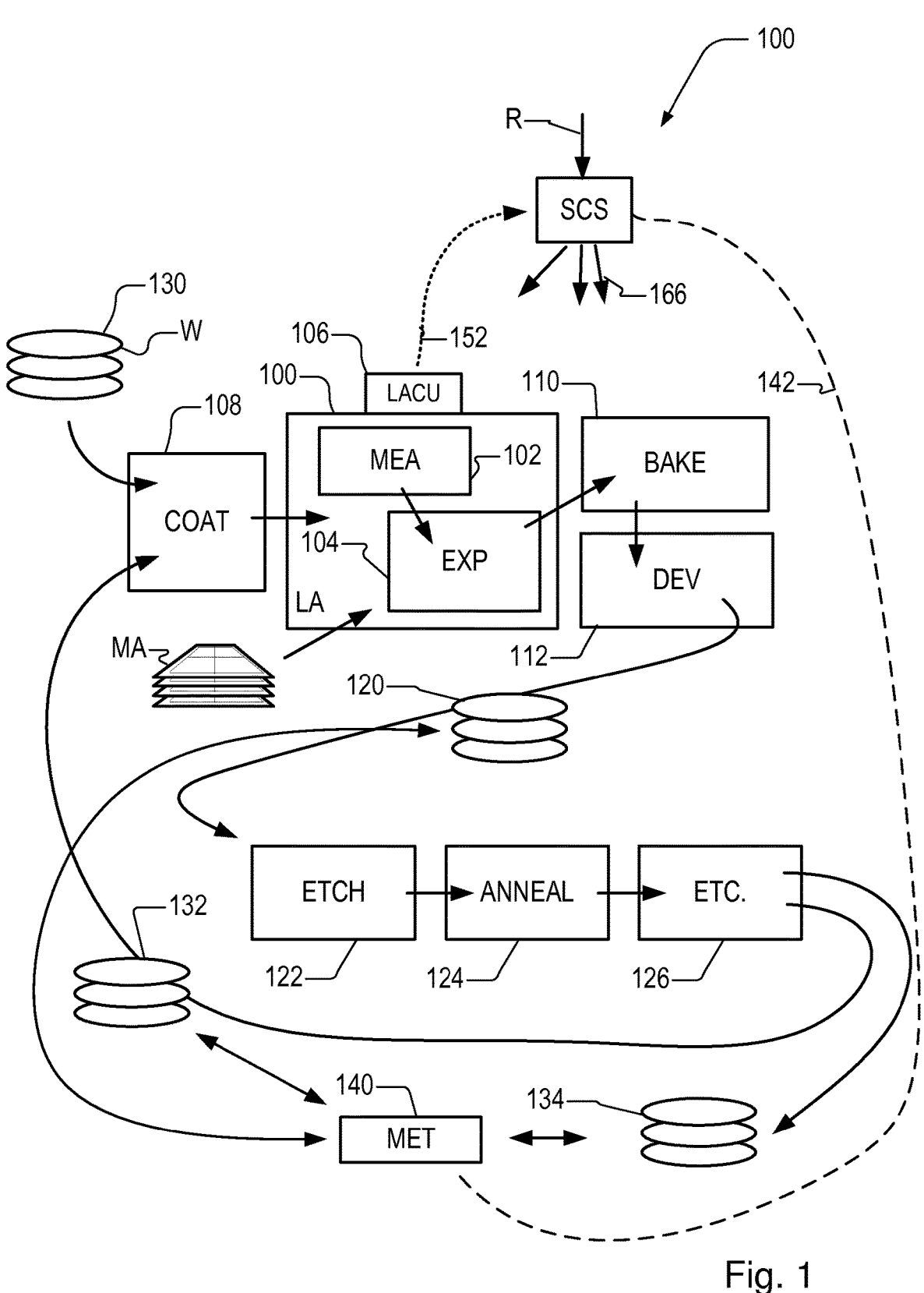
FIG. 1 depicts a lithographic apparatus together with other apparatuses forming a production facility for semiconductor devices.

FIG. 1 at 100 shows a lithographic apparatus LA as part of an industrial production facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 100 for short), a measurement station MEA is shown at 102 and an exposure station EXP is shown at 104. A control unit LACU is shown at 106. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables and two stations—an exposure station and a measurement station—between which the substrate tables can be exchanged.

Within the production facility, apparatus 100 forms part of a "litho cell" or "litho cluster" that contains also a coating apparatus 108 for applying photosensitive resist and other coatings to substrates W for patterning by the apparatus 100. At an output side of apparatus 100, a baking apparatus 110 and developing apparatus 112 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 120 are transferred to other processing apparatuses such as are illustrated at 122, 124, 126. A wide range of processing steps is implemented by various apparatuses in a typical manufacturing facility. For the sake of example, apparatus 122 in this embodiment is an etching station, and apparatus 124 performs a post-etch annealing step. Further physical and/or chemical processing steps are applied in further apparatuses, 126, etc. Numerous types of operation can be required to make a real device, such as deposition of material, modification of surface material characteristics (oxidation, doping, ion implantation etc.), chemical-mechanical polishing (CMP), and so forth. The apparatus 126 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 130 arriving at the litho cluster may be newly prepared substrates, or they may be substrates that have been processed previously in this cluster or in another apparatus entirely. Similarly, depending on the required processing, substrates 132 on leaving apparatus 126 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 126 used at each layer may be completely different in type. Further, even where the processing steps to be applied by the apparatus 126 are nominally the same, in a large facility, there may be several supposedly identical machines working in parallel to perform the step 126 on different substrates. Small differences in set-up or faults between these machines can mean that they influence different substrates in different ways. Even steps that are relatively common to each layer, such as etching (apparatus 122) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 140 which is provided for making measurements of parameters of the products at desired stages in the manufacturing process. A common example of a metrology station in a modern lithographic production facility is a scatterometer, for example a dark-field scatterometer, an angle-resolved scatterometer or a spectroscopic scatterometer, and it may be applied to measure properties of the developed substrates at 120 prior to etching in the apparatus 122. Using metrology apparatus 140, it may be determined, for example, that important performance parameters such as overlay or critical dimension (CD) do not meet specified accuracy requirements in the developed resist. Prior to the etching step, the opportunity exists to strip the developed resist and reprocess the substrates 120 through the litho cluster. The metrology results 142 from the apparatus 140 can be used to maintain accurate performance of the patterning operations in the litho cluster, by supervisory control system SCS and/or control unit LACU 106 making small adjustments over time, thereby minimizing the risk of products being made out-of-specification, and requiring re-work.

Additionally, metrology apparatus 140 and/or other metrology apparatuses (not shown) can be applied to measure properties of the processed substrates 132, 134, and incoming substrates 130. The metrology apparatus can be used on the processed substrate to determine important parameters such as overlay or CD.

During or before any actual imaging, the processing parameters may have a perturbation that causes them to deviate out of specification (e.g., outside of the process window; i.e., a space of processing parameters under which a pattern will be produced within specification) and thus may lead to defects. For example, the focus may change due to topography of a substrate to be exposed, drift in the substrate stage, deformation of the projection optics, etc.; the dose may change to due drift in the source intensity, dwell time, etc. Various techniques may be used to identify a processing parameter that is perturbed and to correct that processing parameter. For example, if the focus is perturbed, e.g., because an area of the substrate that is slightly raised from the rest of the substrate is being exposed, the substrate stage may be moved or tilted to compensate for the perturbation.

Control of the manufacturing (e.g. lithographic) process are typically based on measurements fed back or fed forward and then modelled using, for example inter-field (across-substrate fingerprint) and/or intra-field (across-field fingerprint) models. This modelling may also be extended to include intra-die models (across-die models), as appropriate. Within a die, there may be separate functional areas such as memory areas, logic areas, contact areas etc. Each different functional area, or different functional area type may have a different process window, each with a different processes window center. For example, different functional area types may have different heights, and therefore different best focus settings. Also, different functional area types may have different structure complexities and therefore different focus tolerances (focus process windows) around each best focus.

Other manufacturing processes may also be controlled in such a manner using suitable models to implement corrections. For example, these may comprise correction of an etch process, reticle correction, correction for a track system, correction for a transient model associated with one or more apparatuses utilized in performing said semiconductor manufacturing process.

The control of the lithographic apparatus may be achieved by modeling a correction profile (e.g., a control profile) for the relevant parameter (or co-optimized for more than one parameter). The modelled correction profile for each parameter is fed into the lithographic apparatus, which actuates the desired correction profile to control the lithographic process (exposure). The control may be based on feed forward models (e.g., from data measured within the lithographic apparatus prior to exposure). The scanner itself has self-correction which needs to be actuated during exposures by the scanner. These self-corrections comprise, for example feed forward models such as reticle heating and wafer heating, machine calibrations such as wafer table shape and layout dependent corrections.

Focus control is an example of a mainly feed forward control loop, based on a large amount of levelling data collected for each substrate which is used to determine corrections for exposure on that substrate which corrects for the surface topography. Other corrections are based on feedback control loops. Focus control may, in addition to the main feed forward control just mentioned, also have a feedback element based on measurement of focus from exposed structures. Overlay control is typically based on a feedback loop; based on measurement of overlay from processed substrates. Dose control has no feed forward control other than for mean dose, and is typically controlled in a feedback loop from post exposure (e.g., after-etch) measurement, via a correction profile determined per field (e.g., separately in the scan and slit directions).

All these sources of corrections are input into the lithographic apparatus, which combines all of the corrections per exposure and actuates them, to optimize overlay, focus, dose and imaging performance. There are a number of methods for the lithographic process to actuate the correction profile e.g., for control of focus/dose and/or overlay. An algorithm, essentially behaving as a filter, transforms the corrections into setpoints for the stages and lens/mirrors. The setpoints are defined as time-dependent trajectories e.g., which define the tilting of the reticle stage and/or wafer stage relative to each other during exposure. By moving accordingly, the actuators image the fingerprint onto the substrate. Such methods and others will be readily apparent to the skilled person and will not be discussed further.

All of the control/correction methods described above have an associated cost, in particular in terms of metrology effort. The degree of control or correction for a typical process is a balance between the quality required and the metrology effort. Typically, increased quality requires better corrections which, in turn, requires increased metrology effort. However, for a manufacturing process to be commercially acceptable, a certain productivity level or throughput target is required to be met and increased metrology effort will tend to reduce productivity/throughput. Currently there is no tool which provides a user with a detailed insight into available options for process control (e.g., in terms of yield, overlay or another parameter). In particular, at present there is no tool for identifying which control option, out of a number of possible control options, is most suitable based on expected improvements associated with the control options, and which may take into account aspects such as metrology cost, purchase cost, etc. Guidance for determining a control strategy which best fits the needs for a particular process is an important step during the setup of a semiconductor manufacturing process.

As such, it is proposed to evaluate different process control strategies and/or identify a preferred process control strategy based on:

Process data: this may include historic data and/or design data which characterizes a semiconductor manufacturing process (typically for applying a series of layers to a substrate such as a wafer). Examples of process data may comprise one or more of:

layout data (e.g., design data or reticle data) describing the layout of a particular layer. This may include layout within the die (e.g., the positions and dimensions of different functional areas within the die.

process specification metrics such as process windows which define minimum quality standards such as maximum/minimum allowable values (specification limits) for any parameter (e.g., focus/dose/overlay/edge placement/yield) relevant to the process; process windows may be defined per field, per die, per substrate region and/or per functional area as appropriate. As such, critical structures or functional areas within a die may a more stringent process window associated with them than other structures. Process specification metrics may also include target settings (e.g., best focus settings) for any parameter. Again, these may be set per any of the regions/functional areas as described.

Process context such as: which of the available lithographic apparatuses, etch apparatuses, deposition apparatuses and chambers of mentioned apparatuses were used and/or any settings of these apparatuses, control option settings, sensor readings, product definitions, context granularity.

Candidate process control strategies to be evaluated and any associated parameter settings required for their implementation; these can be input or determined from the process data.

Quality metric prediction data. This may comprise, for example, knowledge of characteristics of the candidate control strategies and/or any other control strategies (e.g., a strategy of reference) suitable for predicting quality metric data, such as how the control strategies will affect performance when applied to the process characterized by said process data. This could be based on:

historic quality metric data relating to the process (e.g., based on metrology or previous yield determinations) and/or modelled/simulated quality metric data relating to the process.

Associated cost metric data for each candidate control strategy and/or any other control strategies (e.g., a strategy of reference): Examples of cost metrics include:

Required metrology effort. This may comprise a measure of how densely and/or how often measurements should be performed to enable a certain control strategy; e.g., the sampling scheme used. A required metrology type may also be defined. The required metrology type may refer to a measurement technique or a measured parameter. The parameters may include one or more of: overlay metrology, focus metrology, CD (critical dimension)/SWA (side wall angle) metrology. The types of metrology may include:

scatterometry based metrology e.g.:

dark field diffraction based overlay/focus techniques (asymmetry techniques), reconstruction based techniques (e.g., from pupil images), scanning electron microscopy, inline metrology vs. offline metrology (e.g., requirement for inline metrology may be attributed a higher cost)

lithographic apparatus (scanner) metrology:

alignment metrology and/or leveling metrology

Other overheads required to implement each candidate control strategy; e.g., required hardware and software and any associated costs (e.g., software licensing costs, hardware costs) associated therewith.

The candidate process control strategies may relate to the settings of and/or correction for any parameter relating to the manufacturing process. These may include (variable) parameters of any apparatus involved (directly or indirectly) in the manufacturing process, such as lithographic apparatus settings (e.g., focus settings, dose settings, stage positioning setpoints); etching apparatus settings, deposition apparatus settings, track apparatus settings, reticle manufacture and/or reticle lithography settings etc. The candidate process control strategies may also relate to a characteristic of a control interface.

The candidate process control strategies may relate to the model used; e.g., types of modeling strategies, e.g., the order (model degree) of any modeling strategy (e.g. first order/ higher order), whether the modeling is per-lot, intra-lot, inter-field, intra-field, inter-die, intra-die and any other relevant model details for simulating any of the manufacturing processes (e.g., for determining corrections).

Figure 2:
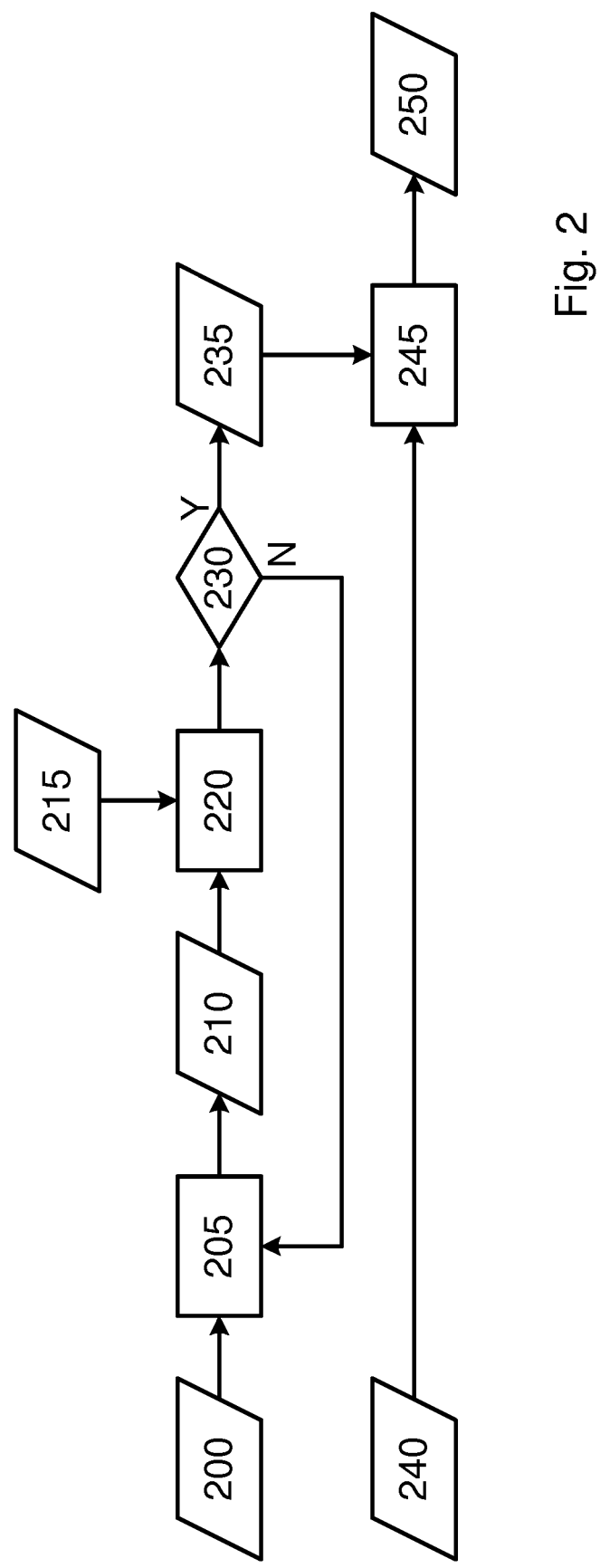
FIG. 2 is a flowchart describing an automated method for selecting an optimal control strategy.

FIG. 2 is a flowchart describing a purely exemplary automated method for selecting an optimal control strategy. This method is described in greater detail in European patent application EP18197856.0, incorporated herein by reference. This method selects and customizes available control strategies, and assesses quality of each control strategy, based on evaluation of simulated on-product performance (associated with a certain input data set) and required metrology effort (e.g., throughput impact). This is done using artificial intelligence (AI) techniques, such as deep learning techniques (e.g., using a neural network) or Bayesian network techniques. The result is a control strategy selection method described above can be made more practical, particularly for evaluation of a very large number of control strategies, and user-independent (e.g. user-specific outcome of advice).

In EP18197856.0, the aforementioned process data, cost metric data and quality metric data is used to train an AI network (e.g., neural network or Bayesian network) to relate process data to the quality metric data, taking into consideration the cost metric data. The quality metric data may be simulated or measured, and may relate to (e.g., comprise values of) any one or more suitable quality metrics (e.g., overlay, edge placement error (EPE) critical dimension (CD), CD uniformity (CDU) or yield).

Referring to FIG. 2, Training data 200 (which may be a subset of validation data 240) is fed into a neural network 205 (or other suitable AI network). The training data comprises process data (which may comprise any of the examples already provided) and associated quality metric data. For example, the training data may comprise control strategies and resultant quality metric values associated with each control strategy. The training data may also comprise cost metric data, e.g., an associated cost for each control strategy. However, this is not necessary and the cost metric may be taken into consideration by the simulation (e.g., error function 215); for example as a boundary condition or constraint. The neural network 205 may begin as a "blank" untrained network, or else it may have been trained in a calibration phase on other training data (e.g., simulated data). Over time, the neural network 205 will learn which control strategies are better candidates for evaluation, and are more likely to result in acceptable performance (according to the quality metric) and acceptable cost (according to the cost metric).

A simulation phase begins to correlate the process data with the quality metric data. Such methods may be based on modeling of Bayesian networks or machine learning methods (deep learning for example) which relate the process data to quality metric data. The simulation phase may begin with the neural network 205 outputting a candidate control strategy 210. A simulation step 220 comprises evaluating an error function 215 based on the candidate control strategy 210. The error function 215 may model an error (residual) for the quality metric data based on the candidate control strategy 210. This error may be, for example, an average (simulated) quality metric value for the training data. As already mentioned, the error function 215 may be boundary conditioned using cost metric data. At step 225, the error is evaluated (e.g., compared to a threshold; for example is the error or number of non-yielding dies <=0) to determine whether the candidate control strategy 210 is acceptable. If not, this is fed back into the neural network 205, and further candidate control strategies 210 are evaluated. When the error is evaluated as acceptable, an optimized control strategy 235 will be output.

The control strategy optimization method may comprise a validation step 245 using a larger data set; i.e., validation data 240, so as to validate the optimized control strategy 235 against the validation data. The validation step 245 may simply repeat simulation step 220 (i.e., evaluate the error function 215) for the optimized control strategy 235 using the larger volume validation data 240. Optionally, the validation step can also output predicted quality metric values 250 (e.g., predicted overlay or EPE) based on the optimized control strategy 235.

An issue with the method described by FIG. 2, is that, to properly train the AI network, an extensive training data set is required. For various reasons (e.g., metrology effort required and/or confidentiality issues), obtaining sufficient training data is difficult. In particular, the training data set available for training the model is often not sufficiently representative for actual processing factors such as excursions, drifts, fingerprints and or noise of one or more processing parameters.

As such, a method for modifying a training data set configured for training of a model will now be described. The method may comprise obtaining a first data set comprising context and/or metrology data associated with a semiconductor manufacturing process and modifying the first data set by introducing variability based on a characteristic of the semiconductor manufacturing process, to obtain said training data set. Alternatively, no first data set is used and the training data comprises entirely synthetic data based on a characteristic of the semiconductor manufacturing process. In this way, a training data set is obtained which is a synthetic or hybrid (semi-synthetic) data set.

Such a method can be used to generate sufficient data needed to properly train the system, from a smaller data set. The synthetic data can be generated from initial measured data based on certain behavioral properties which are known and/or expected to occur. The training data set can then be a hybrid data set including both the synthetic data and the initial measured data from which it is generated. It is also within the scope of this disclosure, to generate fully synthetic data without having any actual metrology data available, i.e., generated from known behavioral properties only.

The behavioral properties can be based on engineering knowledge (known situations known to be possible and for which a proper response is known) and on an existing customer data set. In this manner, the system is able to give preliminary control advice based on the limited data set available. Behavioral properties may include, for example, one or more of:

spatial fingerprints (spatial parameter distributions including inter-field fingerprints, intra-field fingerprints and/or other fingerprints) which may be imposed by any tool or effect (e.g., fingerprints resultant from processing, clamping, lens aberration, etch, deposition, focus/dose, reticle heating or other heating effects etc.);

temporal noise/drift of any parameter;

context, or context granularity, e.g., which etch chambers, lithography stages and/or deposition stations or other processing history a substrate has been subject to, and the possible combinations of these;

relationships between different types of data and/or between similar processes;

predicted events (e.g., disturbing events and/or excursions in metrology data) to which the system should respond, for example by actively implementing a responsive change or deciding to ignoring the event depending on the desired training outcome;

Boundary conditions such as performance specifications, measurement budgets available control options and any control settings—however, any boundary conditions may instead be imposed by the simulation (e.g., error function 215).

Using one or both of known behavioral properties and any actual metrology results, synthetic data can be produced. The synthetic data may, for example, be based on an extrapolation and/or interpolation of a behavioral property over time (e.g., over additional substrates or lots). For example, the synthetic data may describe how a parameter varies over time for a time period not measured, e.g., for modelled substrates or lots. By way of a specific example, if metrology data for a parameter is available for only a few lots (or none is available at all), but the behaviour of this parameter is known, e.g., as a function of time, substrate number or lot number, then parameter values can be interpolated for lots in between said few lots and/or extrapolated (e.g., by regression or similar modelling technique) for many more lots (e.g., much further into the future and/or additional lots between measured lots). A regression could also be performed based solely on the available metrology data, with behavioral properties inferred therefrom. In this way, for example, synthetic metrology data describing one or more parameters over a large number of lots can be generated from real metrology data from a small number of lots (or none at all).

Other methods of generating synthetic data is possible, e.g., by generating one type of data from another. For example, if the relationship between a parameter measured after-development (before etch) and after-etch is known, then after-etch parameter values can be generated from after-development parameter values and vice versa. Also, if the effect of noise, any other effect (e.g., heating or a lens aberration) or any disturbing event is known, then the effect of variation of any of these effects/events on a parameter could be inferred/evaluated so as to generate synthetic data. Therefore, for example, synthetic metrology data for different noise levels could be generated, as could synthetic metrology data describing a parameter subject to a different level of reticle heating or a different lens aberration effect with respect to the actual measurements performed.

Additional data can also be generated spatially based on sparser measurements. For example, where metrology data for only a few points on a substrate is available, additional metrology data can be calculated for other locations on the substrate.

Different contexts could also be considered. For example, where a process fingerprint is known for each lithography stage, etch chamber and/or any other processing station, then the combined fingerprints (and effects thereof) of any combination of these can be generated, either based on measurements of one or a few lots relating to a much smaller subset of possible combinations, or on no actual measurements at all.

Another way of producing synthetic metrology data may be based on characteristics (fingerprints/drifts) associated with applications other than the application of interest, but due to a commonality between application of interest and other application there can be assumed to be a commonality in characteristic behaviour. For example, the synthetic data for a specific process or layer may be derived from metrology data of another process or layer due to known commonalities between the processes or layers (e.g., shared processing stations/contexts).

The synthetic metrology data introduces variability/behavior which can be used to train a model (e.g., neural network) more rapidly, such that the model becomes trained in advance for realistically occurring process variations which are representative for the process of interest Once the AI system is trained and in use, it can continue learning while receiving actual metrology data (e.g., generated during production). It will then learn from other specific behaviors which may not have been anticipated in the training data. This additional metrology data will enable the system to better fine tune its output where needed. This can be advantageous as it is possible that the synthetic data does not cover all behaviors which occur in real production conditions.

Figure 3:
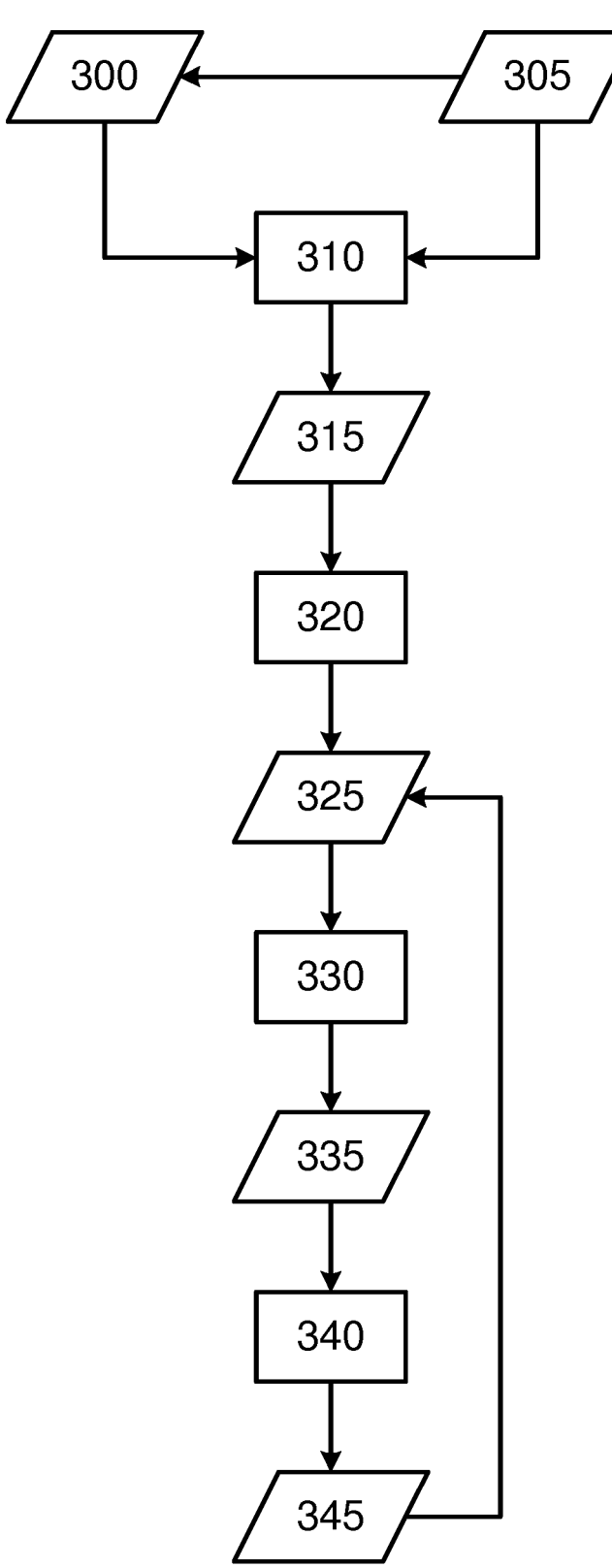
FIG. 3 is a flowchart describing a method of generating synthetic training data for training a model used in FIG. 2.

FIG. 3 is a flowchart describing such a method. Known behavioral properties of a process 300 and (optionally) metrology data 305 are used to generate synthetic data 310 to obtain training data 315 (training data 315 may also include the actual metrology data 300). The generation step 310 may use any of the methods for generating synthetic training data disclosed herein. A model training step 320 may use the training data 315 to train a model such as a neural network, to obtain a trained model 325.

At step 330, the trained model is used to provide control advice 335 as already described. This may comprise an advised control strategy (or a number of ranked strategies) for a specific use-case (e.g., a particular product and layer combination). This may comprise advising on which control component may be preferred (e.g., a particular software and/or hardware tool) and/or the settings per control component. This step may also comprise predicting the outcome of a lithographic process and advise thereon. At step 340, feedback data 345 may be collected. The feedback data may be specific for a control use-case, e.g., per specific product and layer combination, and comprise metrology information from substrates subject to control strategies determined by the trained model, along with the corresponding control strategies selected. The feedback data 345 may comprise any other relevant information (e.g., relating to and/or describing the structures and/or stack of the process being controlled/advised upon). This feedback data 345 can be fed back to the model 325, which can evaluate and learn to improve itself (e.g., determine the effectiveness of a particular control strategy based on corresponding metrology). Further embodiments of the invention are disclosed in the numbered list of clauses below:

1. A method for obtaining a training data set comprising synthetic metrology data, said training data set being configured for training of a model relating to a manufacturing process for manufacturing an integrated circuit, the method comprising:

obtaining behavioral property data describing a behavior of a process parameter resultant from the manufacturing process and/or a related tool or effect, and/or obtaining metrology data performed on a structure formed by said manufacturing process and/or a similar manufacturing process;

determining, from said behavioral property data and/or metrology data, said synthetic metrology data describing the effect of variations in said manufacturing process, and/or a related tool or effect on said process parameter; and using said training data set comprising said synthetic metrology data to train said model.

2. The method of clause 1, wherein the model is based on a neural network.

3. The method of clause 1 or 2, wherein behavioral property data comprises data relating to one or more of: spatial parameter distributions imposed by any tool or effect, temporal noise/drift of any parameter, context, or context granularity, relationships between different types of data and/or between similar processes and predicted events to which the system should respond.

4. The method of any preceding clause, wherein said synthetic metrology data is determined from both said behavioral property data and said metrology data.

5. The method of clause 4, wherein said training data set comprises both of said synthetic metrology data and said metrology data.

6. The method of any preceding clause, wherein determining said synthetic metrology data comprises interpolating and/or extrapolating the behavioral property over time to obtain extrapolated process parameter values.

7. The method of any preceding clause, wherein determining said synthetic metrology data comprises converting one type of metrology data into another type of metrology data.

8. The method of any preceding clause, wherein determining said synthetic metrology data is based on behavioral property data and/or metrology data associated with one or more applications other than an application of interest, where it is assumed due to be a commonality in characteristic behaviour between the one or more applications and the application of interest.

9. The method of any preceding clause, wherein said synthetic metrology data is generated for different combinations of processing stations of the manufacturing process.

10. The method of any preceding clause, wherein, during use of the model to advise on an aspect of the manufacturing process, metrology device relating to the manufacturing process and the corresponding advice from the model is fed back as feedback data to further train the model.

11. The method of clause 10, wherein the feedback data further comprises data relating to the actual structure or stack formed in the manufacturing process.

12. The method of any preceding clause, wherein the model is configured to determine a preferred control strategy for control of the manufacturing process.

13. A method of any preceding clause, further providing a control recipe associated with the preferred control strategy.

14. The method of any preceding clause, wherein the model is configured to evaluate a plurality of candidate control strategies based on process data relating to the manufacturing process.

15. The method of clause 14, wherein the evaluation step is implemented by minimizing an error function for the quality metric.

16. The method of clause 14 or 15, wherein the model is configured to evaluate the plurality of candidate control strategies based on cost metric data, said cost metric data comprising associated cost metrics for said candidate control strategies.

17. A method of any preceding clause, further providing a control recipe associated with the preferred control strategy.

18. A computer program comprising program instructions operable to perform the method of any preceding clause, when run on a suitable apparatus.

19. A non-transient computer program carrier comprising the computer program of clause 18.

Although patterning devices in the form of a physical reticle have been described, the term "patterning device" in this application also includes a data product conveying a pattern in digital form, for example to be used in conjunction with a programmable patterning device.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method comprising:
  obtaining behavioral property data for a physical manufacturing process for manufacturing an integrated circuit, the behavioral property data describing a relation between (a) one or more values of a process parameter before execution or occurrence of a variation of the physical manufacturing process and/or variation of a related tool or effect of the physical manufacturing process and (b) one or more values of the same process parameter after the execution or occurrence of the variation of the physical manufacturing process and/or variation of the related tool or effect;
  generating, from the behavioral property data, values of synthetic metrology data describing an effect of variations of the physical manufacturing process and/or of the related tool or effect, on the process parameter;
  training a model relating to the physical manufacturing process using a training data set comprising the synthetic metrology data; and
  providing a signal based on an output of the trained model to a tool or system for use by the tool or system in configuring the physical manufacturing process.

2. The method of claim 1, wherein the model is based on a neural network.

3. The method of claim 1, wherein behavioral property data comprises data relating to one or more selected from: a spatial parameter distribution imposed by any tool or effect, temporal noise/drift of any parameter, context, or context granularity, and/or a relationship between different types of data and/or between similar processes and predicted events to which the system should respond.

4. The method of claim 1, wherein determining the synthetic metrology data comprises interpolating and/or extrapolating the behavioral property data over time to obtain extrapolated process parameter values.

5. The method of claim 1, wherein determining the synthetic metrology data is based on other behavioral property data associated with one or more applications other than an application of interest, where there is a presumed commonality in characteristic behavior between the one or more applications and the application of interest.

6. The method of claim 1, wherein the synthetic metrology data is generated for different combinations of processing stations of the physical manufacturing process.

7. The method of claim 1, wherein, during use of the model to advise on an aspect of the physical manufacturing process, metrology data relating to the physical manufacturing process and the corresponding advice from the model is fed back as feedback data to further train the model.

8. The method of claim 1, wherein the model is configured to determine a preferred control strategy for control of the physical manufacturing process.

9. The method of claim 8, further comprising providing a control recipe associated with the preferred control strategy.

10. The method of claim 1, wherein the model is configured to evaluate a plurality of candidate control strategies based on process data relating to the physical manufacturing process.

11. The method of claim 10, wherein the evaluation of the plurality of candidate control strategies is implemented by minimizing an error function for a quality metric.

12. The method of claim 10, wherein the model is configured to evaluate the plurality of candidate control strategies based on cost metric data, the cost metric data comprising associated cost metrics for the candidate control strategies.

13. A computer program product comprising a non-transitory computer-readable medium comprising program instructions therein, the instructions, upon execution by a computer system, configured to cause the computer system to at least:
  obtain behavioral property data for a physical manufacturing process for manufacturing an integrated circuit, the behavioral property data describing a relation between (a) one or more values of a process parameter before execution or occurrence of a variation of the physical manufacturing process and/or variation of a related tool or effect of the physical manufacturing process and (b) one or more values of the same process parameter after the execution or occurrence of the variation of the physical manufacturing process and/or variation of the related tool or effect;
  generate, from the behavioral property data, values of synthetic metrology data describing an effect of variations in the physical manufacturing process and/or the related tool or effect, on the process parameter;
  train a model relating to the physical manufacturing process using a training data set including the synthetic metrology data; and
  provide a signal based on an output of the trained model to a tool or system for use by the tool or system in configuration of the physical manufacturing process.

14. The computer program product of claim 13, wherein the model is based on a neural network.

15. The computer program product of claim 13, wherein the behavioral property data comprises data relating to one or more selected from: a spatial parameter distribution imposed by any tool or effect, temporal noise/drift of any parameter, context, or context granularity, and/or a relationship between different types of data and/or between similar processes and predicted events.

16. The computer program product of claim 13, wherein the instructions configured to determine the synthetic metrology data are further configured to determine the synthetic metrology data based on other behavioral property data associated with one or more applications other than an application of interest, where there is a presumed commonality in characteristic behavior between the one or more applications and the application of interest.

17. The computer program product of claim 13, wherein the model is configured to determine a preferred control strategy for control of the physical manufacturing process.

18. The computer program product of claim 17, wherein the instructions are further configured to provide a control recipe associated with the preferred control strategy.

19. The computer program product of claim 13, wherein the instructions configured to determine the synthetic metrology data are further configured to generate the synthetic metrology data for different combinations of processing stations of the physical manufacturing process.

20. The computer program product of claim 13, wherein, during use of the model to advise on an aspect of the physical manufacturing process, metrology data relating to the physical manufacturing process and the corresponding advice from the model is fed back as feedback data to further train the model.

* * * * *